(12) United States Patent
Nyswander

(10) Patent No.: US 6,914,556 B1
(45) Date of Patent: Jul. 5, 2005

(54) METHOD AND APPARATUS FOR MAGNETRON COHERENCE

(75) Inventor: Reuben E. Nyswander, China Lake, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 1826 days.

(21) Appl. No.: 05/803,327

(22) Filed: May 31, 1977

(51) Int. Cl.[7] ............................................. G01S 7/282
(52) U.S. Cl. .................... 342/204; 342/175; 331/87
(58) Field of Search ............................ 328/65; 331/87, 331/5; 342/175, 204; 315/39.3, 39.51; 330/47; 333/138, 141, 150; 375/308, 309; 455/103, 119, 25, 91

(56) References Cited

U.S. PATENT DOCUMENTS

| | | | | |
|---|---|---|---|---|
| 2,666,849 A | * | 1/1954 | Johnson et al. | 328/65 |
| 2,750,506 A | * | 6/1956 | Haagensen | 331/87 |
| 2,824,231 A | * | 2/1958 | Feinstein et al. | 331/87 |
| 2,835,811 A | * | 5/1958 | Bruyning | 331/87 |
| 2,914,734 A | * | 11/1959 | Parker | 331/87 |
| 3,657,656 A | * | 4/1972 | Cooper | 375/309 |
| 3,701,020 A | * | 10/1972 | De Vito | 375/308 |
| 3,868,539 A | * | 2/1975 | Farney | 315/39.3 |
| 3,955,158 A | * | 5/1976 | Upadhyayula et al. | 333/141 |
| 4,051,439 A | * | 9/1977 | Nyswander | 331/87 X |
| 4,100,369 A | * | 7/1978 | Stenstrom et al. | 375/308 |
| 4,104,561 A | * | 8/1978 | Iwata | 315/101 |
| 4,109,179 A | * | 8/1978 | McKinnon | 315/39.75 |
| 4,109,216 A | * | 8/1978 | Nyswander | 331/87 |
| 4,131,824 A | * | 12/1978 | Nakai et al. | 315/39.51 |
| 4,131,825 A | * | 12/1978 | Mattsson | 315/39.61 |
| 4,132,921 A | * | 1/1979 | Hatayama et al. | 315/39.51 |
| 4,193,032 A | * | 3/1980 | Milberger et al. | 178/116 |

FOREIGN PATENT DOCUMENTS

| | | | | |
|---|---|---|---|---|
| DE | | 895787 | * 11/1953 | 331/87 |

* cited by examiner

*Primary Examiner*—John B. Sotomayor
(74) *Attorney, Agent, or Firm*—W. Thom Skeer; Charlene A. Haley

(57) ABSTRACT

A pulsed magnetron is caused to emit a series of RF energy pulses which are phase coherent with an injection signal by supplying the magnetron with a pedestal pulse during low-power signal injection. The pedestal being of a magnitude and duration such that the slow-rise-time pedestal portion holds the magnetron in the Hartree region during the signal injection.

11 Claims, 2 Drawing Sheets

METHOD AND APPARATUS FOR MAGNETRON COHERENCE

BACKGROUND OF THE INVENTION

1. Field of the Invention

This invention pertains to the field of electronics. In greater particularity, this invention pertains to microwave electronic circuitry. By way of further characterization, but without limitation thereto, this invention pertains to the modulation of magnetron oscillators. More specifically the invention will be described as it pertains to the generation of extremely short pulses of coherent microwave energy.

2. Description of the Prior Art

The development of high-resolution radar systems and other radar applications where high-resolution is desired, the use of short pulse duration transmitting modes have achieved popularity because of the reduction of minimum range coverage and high-target resolution. Great strides have been made in recent years in short-pulse operation by using pedestal pulse modulators. Examples of which are shown in U.S. Pat. No. 3,273,075 issued Sep. 13, 1996 to H. L. Kennedy for "Pulse Generator System Providing Pulse Superimposed On A Pedestal" and in U.S. Pat. No. 4,051,439, issued Sep. 27, 1997 to Reuben E. Nyswander for "Short Pulse Magnetron Transmitter".

Another approach for radar signal processing employs coherent transmitted pulses which make possible much more target information than can be-obtained with a non-coherent system. For example, coherent pulses permit processing to obtain Doppler information indicative of target movement. Such arrangements have applications in synthetic aperture systems and moving target indicating systems. Heretofor, obtaining coherence in transmitting radar systems have ranges of coherence limited to approximately 10 Mz. Naturally, such limitations are reflected in limitations of application which could be vastly improved if coherence could be obtained over a wider frequency range.

SUMMARY OF THE INVENTION

The invention provides a method and system of radar pulse generation in which pulses of extremely short duration are generated with coherence over wide frequency ranges. These enhanced benefits of the system are obtained by using a signal injection of a coherent microwave signal together with a pedestal pulse generator. The magnitude and duration of a pedestal is chosen such that the resonant-cavity-oscillator or magnetron is held in the Hartree voltage region in which internal electrical oscillations occur but are of such magnitude that the output is negligible. In this fashion, the injected signal causes the magnetron to function in a coherent mode such that the short duration drive pulse causes full output therefrom. Thus, the primary object of the invention to obtain a short-duration, coherent burst of microwave energy is realized.

DESCRIPTION OF THE PREFERRED EMBODIMENT

Figure 1:
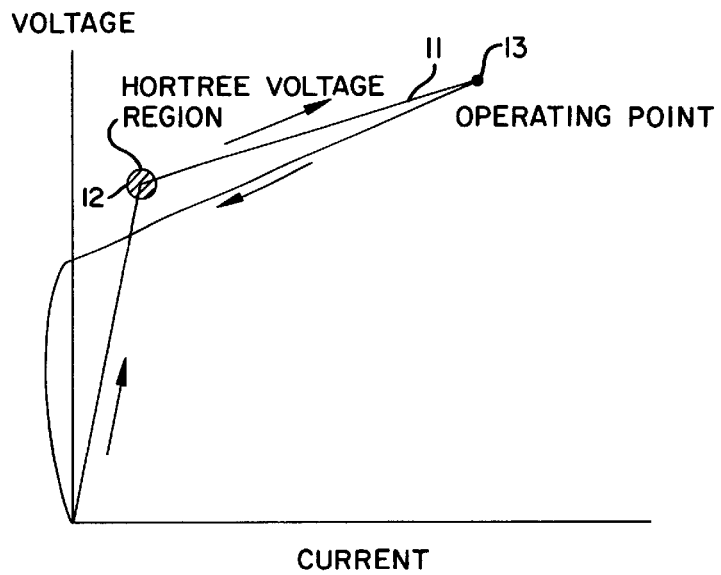
FIG. 1 is a voltage-current plot of a typical resonant cavity oscillator.

Referring to FIG. 1, the operational characteristics of a typical magnetron are illustrated. Curve 11 starts from the origin of zero volts and current and rises rapidly in voltage until a level indicated at region 12 called the Hartree voltage region in which electron oscillation starts within the internal cavities of the resonant cavity oscillator. In this operational region, there is low magnetron current indicating a minimal output. If the drive voltage is increased beyond this point, the current flowing in the magnetron increases rapidly to reach a point 13 which is the optimum operating point for a given electrical operational level. When the voltage is removed, the current falls rapidly and the voltage returns to zero. A slight overshoot in the return voltage is indicative of the collapse of the electrical energy stored in the circuit components comprising the system.

Figure 2:
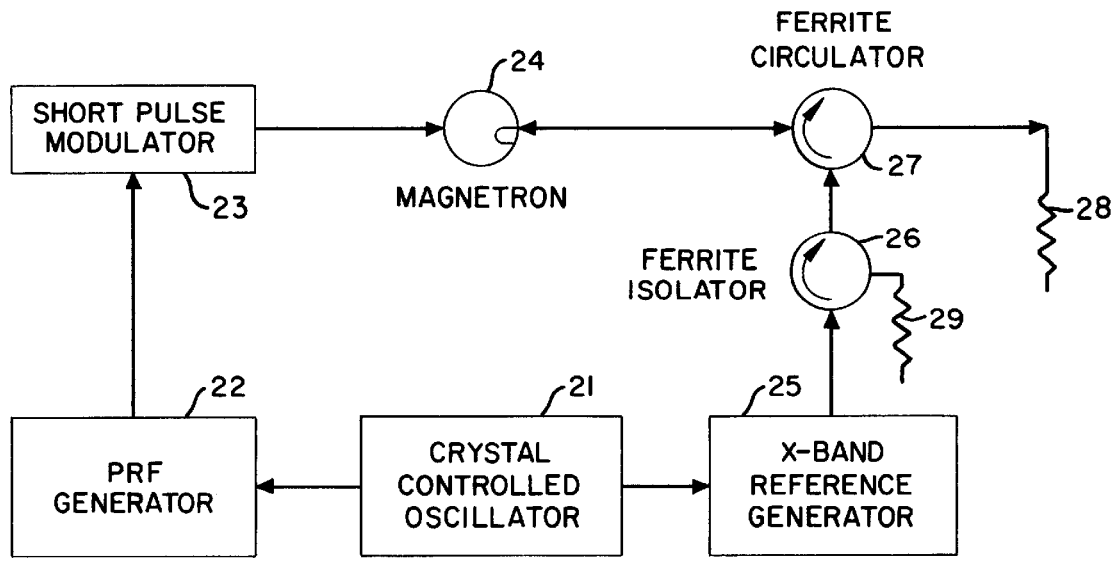
FIG. 2 is a block diagram illustrating the system of the invention.

Referring to FIG. 2, the system of the invention as illustrated. A crystal controlled oscillator 21 generates a frequency stable master frequency. This circuit is connected to a pulse recurring frequency generator which establishes the pulse recurring frequency, PRF, of the system. The output of the PRF generator 22 is coupled to a short pulse modulator 23, to be described in greater detail herein. Modulator 23 generates a pedestal pulse which is applied to the magnetron 24.

Crystal controlled oscillator 21 also outputs a frequency-stable signal to X-band reference generator 25 which may be considered a frequency multiplier which converts the crystal controlled oscillator output to a continuous-wave X-band signal. The output of X-band reference generator 25 is, in turn, connected via ferrite isolator 26 and ferrite circulator 27 to magnetron 24 where it serves as an injection frequency.

Ferrite isolator 26 and circulator 27 are conventional state-of-the-art devices which are used to establish a directional coupling in the direction indicated by the arrow. As is conventional in their applications, Ferrite circulator 27 has a load resistance 28 connected thereto which in a radar system would be a radar antenna and, ferrite isolator 26 has a load resistance 29 connected thereto. It will be understood by those familiar with the operation of these devices that energy from X-band reference generator 25 is coupled through these units to magnetron 24, whereas energy reflected back to the unit is circulated in the direction indicated by the arrow and is dissipated in the associated load resistor 29.

The pedestal or low rise time long pulse component of short pulse modulator 23 serves to elevate magnetron 24 to the Hartree voltage region. During this time interval, the injected signal of X-band reference generator 25 via ferrite isolator 26 and ferrite circulator 27 causes oscillation in magnetron 24 to commence but at such a reduced level that no output is evidenced therefrom. With the application of the short duration pulse carried on the pedestal pulse, magnetron 24 is driven to full output such that each pulse is coherent with the injected signal and, hence, with each other pulse. It will be obvious, that such a system permits much greater latitude in radar circuitry than heretofore possible. In laboratory tests, using a type MA249B magnetron, pulse coherence over a 200 Mz range has been obtained. This wide range permits X-band reference generator 25 to generate a local oscillator signal which is useful in processing the received pulses although the magnetron output may be at a frequency separated by the intermediate frequency therefrom.

Figure 3:
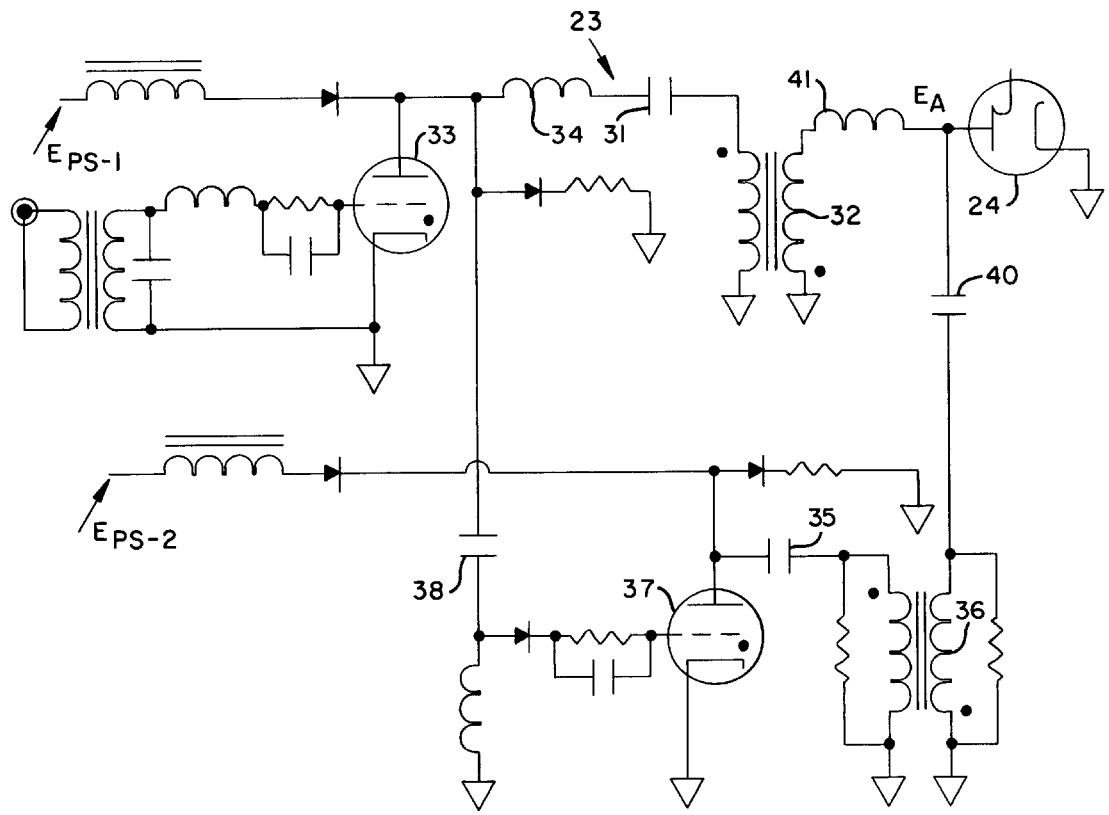
FIG. 3 is a schematic diagram of the short pulse modulator illustrated in FIG. 2.

Referring to FIG. 3, short pulse modulator 23 is illustrated in greater detail. An energy storage means such as capacitor 31 is charged to a reference level approximately twice $E_{PS-1}$ due to D.C. resonance charging via a transformer 32 connected thereto. Capacitor 31 may be discharged by an associated switch device such as gas tube 33, through transformer 32, to produce a voltage pulse applied to magnetron 24. Of course, the waveform, including rise time and duration, will be controlled by conventional LC circuitry and, for example, may be regulated by an inductor 34 connected in series therewith. In a similiar fashion, the short pulse portion of the pedestal pulse may be generated by an energy storage device such as capacitor 35 charging to a reference voltage approximately twice $E_{PS-2}$ via a second transformer 36. Similarily, capacitor 35 may be discharged via a gas tube 37 to produce a short pulse which is transformer coupled to magnetron 24. Gas tube 37 may be triggered by the discharge of a capacitor 38 which is similiarly charged to the voltage value on capacitor 31 and discharged through switch 33. By choosing the value of components in the discharge path of capacitor 38, a predetermined delay for the operation of switch 37 may be achieved. The long pulse and short pulse circuits are connected to magnetron 24 via an RF choke 41 and capacitor 40, respectively such that interaction therebetween may be minimized. The resulting waveform, appearing at point $E_A$, is illustrated in the accompanying FIG. 4.

Figure 4:
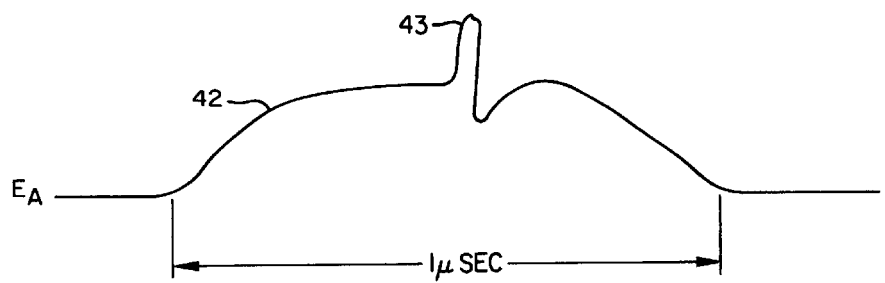
FIG. 4 is a waveform showing the pedestal and short pulse modulation signals.

Referring to FIG. 4, waveform $E_A$ is indicated by a gently rising voltage at point 42 having a short-duration pulse 43 imposed thereon. As previously noted, the rise time and duration of waveform $E_A$ may be controlled by selection of component values in the discharge path of capacitor 31.

As will be familiar to those versed in the art, the selection of these values will depend upon the particular magnetron type employed. Similarly, the selection of the values of $E_{PS-1}$ and $E_{PS-2}$ which, ultimately, determine the magnitude of waveform $E_A$ such that the pedestal portion indicated at 42 holds the magnetron in Hartree region a sufficient length of time that coherent oscillations may be reliability started. Likewise, the value of $E_{PS-2}$ is similiarly chosen such that the narrow pulse 43 causes magnetron 24 to achieve full output potential illustrated at point 13, FIG. 1, of the particular magnetron chosen. The time duration of 1 microsecond illustrated in FIG. 4 is representative of values obtained with the system. The duration of short duration pulse 43 in such systems have reliably achieved pulse widths of less than 10 nanoseconds.

In the construction and operation of the system, conventional engineering practice for the microwave arts is, of course employed. Within the limits of good design practice, substitutions of component values and types may be practiced with the expected engineering tradeoffs. For example, the invention is illustrated using thermonic switches, however, within the availability of suitable hardware, their solid state equivalents may be employed.

The foregoing description taken together with the appended claims constitute a disclosure such as to enable a person skilled in the microwave and electronics arts, having the benefit of the teachings contained therein, to make and use the invention. Further, this structure and a method herein described is seen to constitute a meritorious advance in those arts unobvious to such a person not having the benefit of those teachings.

What is claimed is:

1. A method of producing pulsed coherent radio frequency energy comprising:

providing a resonant cavity oscillator with operating field and emission control voltages;

applying a pedestal voltage pulse to the resonant cavity oscillator;

applying a coherent injection signal to resonant cavity oscillator simultaneously with said pedestal voltage; and applying a drive pulse of shorter duration than said pedestal voltage pulse to the resonant cavity oscillator during the application of said pedestal voltage application such that the resonant cavity oscillator is caused to output a radio frequency energy pulse of the same duration as the drive pulse and coherent with said injection signal.

2. A method of producing pulsed coherent radio frequency energy according to claim 1 wherein said applied pedestal voltage is of a predetermined magnitude to reach the Hartree operational point of the resonant cavity oscillator.

3. A method of producing pulsed coherent radio frequency energy according to claim 1 in which the coherent injection signal is of an amplitude and frequency having a predetermined relationship to the operating output power and frequency of the resonant cavity oscillator.

4. A method of producing pulsed coherent radio frequency energy according to claim 3 in which said predetermined frequency relationship includes 200 MH frequency range bracketing the resonant frequency of the resonant cavity oscillator.

5. A method of producing pulsed coherent radio frequency energy according to claim 3 in which said predetermined amplitude relationship includes at least a forty decibel range between the injection signal and output signal taken from said resonant cavity oscillator.

6. A system for providing a short-pulse-duration pulsed radio frequency signal comprising:

a resonant cavity oscillator;

conditioning signal source means effectively connected to said resonant cavity oscillator for supplying a pulsed signal having a predetermined amplitude insufficient to effect significant output from said resonant cavity device, but sufficient to permit oscillations to start;

an injection signal source effectively connected to said resonant cavity oscillator for supplying a radio frequency signal thereto simultaneously with said conditioning signal; and drive signal source means effectively connected to said conditioning signal source means and to said resonant cavity oscillator for applying a trigger signal thereto in synchronism with said conditioning signal said trigger signal having a fast rise time and short duration as compared with said conditioning signal.

7. A system for providing a short-duration pulsed radio frequency signal according to claim 6 in which said conditioning signal source means includes:

a source of charging voltage;

storage means connected to said source of charging voltage for storing electrical energy therefrom a switch connected to said storage means for selective discharge thereof;

a transformer connected to said storage means so as to be in the discharge path thereof and effectively connected to said resonant cavity oscillator for transfering the discharge waveform thereto.

8. a system for providing a short-duration pulsed radio frequency signal according to claim 6 in which said injection signal source includes a coherent microwave generator.

9. A system for providing a short-duration pulsed radio frequency according to claim 8 in which said coherent microwave generator is coupled to the aforesaid resonant cavity oscillator by means of a ferrite circulator.

10. A system for providing a short-duration pulsed radio frequency signal according to claim 6 in which said drive signal source means includes a capacitor discharge circuit which is transformer coupled to the aforesaid resonant cavity oscillator.

11. A system for providing a short-duration pulsed radio frequency signal according to claim 10 further including isolation means connected to said resonant cavity oscillator and to said drive and conditioning circuits to prevent circuit interaction therebetween.

\* \* \* \* \*